United States Patent [19]
Hshieh et al.

[11] Patent Number: 5,763,915
[45] Date of Patent: Jun. 9, 1998

[54] DMOS TRANSISTORS HAVING TRENCHED GATE OXIDE

[75] Inventors: Fwu-Juan Hshieh, Saratoga; True-Lon Lin, Cupertino; Danny Chi Nim, San Jose; Koon Chong So, Santa Clara; Yan Man Tsui, Union City, all of Calif.

[73] Assignee: MageMOS Corporation, San Jose, Calif.

[21] Appl. No.: 607,715

[22] Filed: Feb. 27, 1996

[51] Int. Cl.⁶ .............................. H01L 29/76; H01L 29/94
[52] U.S. Cl. .......................... 257/330; 257/334; 257/337; 257/338
[58] Field of Search ................................. 257/330, 334, 257/337, 338

[56] References Cited

U.S. PATENT DOCUMENTS

4,547,791  10/1985  Roger et al. .............................. 257/330
5,541,425   7/1996  Nishihara ................................. 257/330

Primary Examiner—Carl W. Whitehead
Attorney, Agent, or Firm—Bo-In Lin

[57] ABSTRACT

Improved power MOSFET structure, and fabrication process are disclosed in this invention to achieve cost savings by simplified device structure and fabrication processes, and also by reducing the required die size. Specifically, in a novel MOSFET device, insulation of mobile ions are achieved by extending the poly gate and metal contacts such that the passivation layer is no longer required and the fabrication process is simplified such that the MOSFET device can be manufactured at a lower price. Furthermore, in another MOSFET device, the gate runner is used to replace the field plate such that the requirement of a field plate as that in a conventional MOSFET device is also eliminated and, by reducing the die size, the cost of manufacture is further reduced.

7 Claims, 14 Drawing Sheets

DMOS TRANSISTORS HAVING TRENCHED GATE OXIDE

BACKGROUND OF THE INVENTION

1. Field of the Invention

This invention relates generally to the structure and fabrication process of trenched DMOS transistors. More particularly, this invention relates to a novel and improved structure and process for fabricating trenched DMOS transistors with novel gate contact configuration in the termination area at the end of trench to achieve higher breakdown voltage and also, to eliminate the requirement of a poly mask such that the DMOS devices can be manufactured at lower cost.

2. Description of the Prior Art

The technology for fabrication of a conventional trenched double-diffusion metal oxide semiconductor (DMOS) device still experiences a technical difficulty that vulnerable spots exist in the gate oxide layer near the end-point of the trenches underneath the gate contacts. These vulnerable end-points are susceptible to voltage breakdown due to the special configuration of the gate oxide under the polysilicon gates in the termination area. The polysilicon gates are configured to lay-over the trench edges and corners near the end-points in order to provide 'gate-extensions' to form gate contacts thereon. With the gate polysilicon layer overlaying the edges and corners of the trenches, these weak points in the gate oxide layer underneath the gate are created where early breakdowns often occur when gate voltage is applied. These vulnerable points adversely affect the reliability and performance of the DMOS devices and as a consequence causes the cost of device testing and fabrication to increase.

Figure 1:
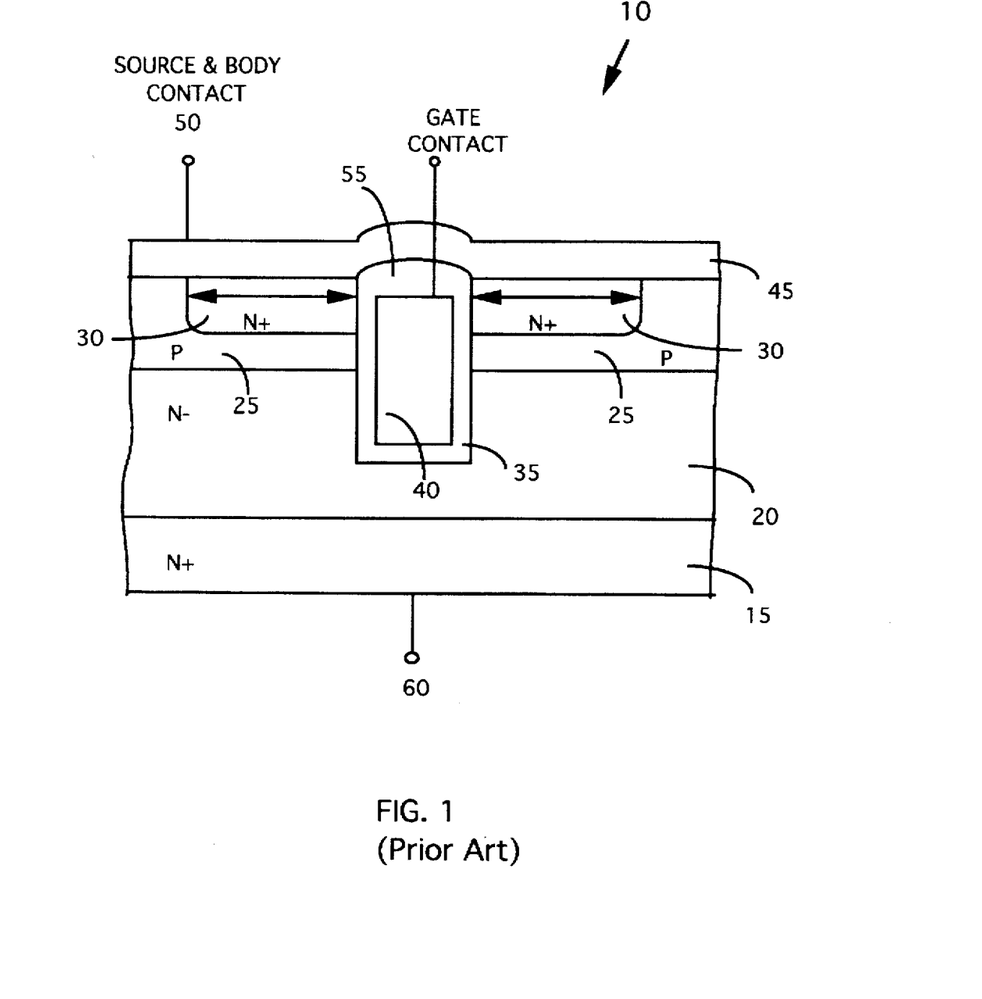
FIG. 1 is a cross-sectional view of a prior art structure of a general DMOS.

In order to better understand the technical background of the present invention, the general device structure of a trenched DMOS transistor is first described. FIG. 1 is a cross-sectional view of a typical DMOS cell 10 in the core cell region which is supported on a N+ substrate 15 and an N− epi-taxial layer 20 formed on its top. The cell 10 includes a deep p-body region 25, a source region 30 wherein the source region 30 and the p-body region 25 surround a trenched gate 40 insulated by a gate oxide layer 35. The DMOS cell 10 is then covered with a PSG or BPSG protection layer 45 and connected externally with a gate contact 55, a source and body contact 50 and a drain contact 60. This device structure with the gate formed in a trench has the advantage that the cell density can be increased by shrinking the poly-gate length without the limitation, as that encountered in a planar DMOS, that the JFET resistance is increased when the gate poly length is reduced. The trenched DMOS transistors also have the additional benefits that the on-resistance is reduced as the result of higher cell density.

Figure 2:
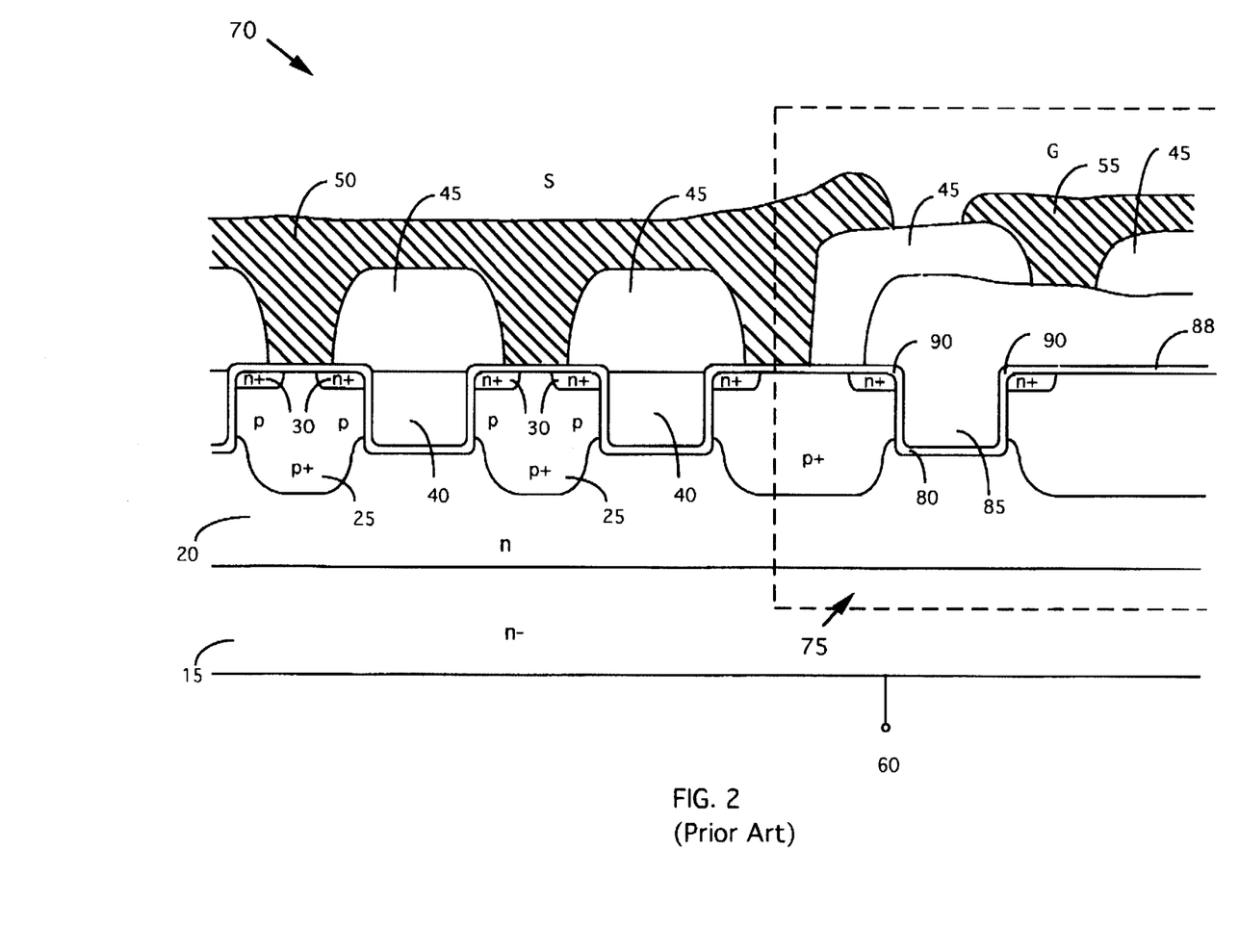
FIG. 2 is a cross sectional view of the layer structure of a prior art DMOS near the termination area where breakdown weak points are generated due the poly-gate structure.

FIG. 2 shows a cross sectional view of a DMOS transistor 70 near the termination region 75. The core cell region includes a plurality of DMOS cells 10 as that shown in FIG. 1 including sources 30, p-body regions 25, poly-gates 40 formed in the trenches, and source and drain contacts 50 and 60 respectively as described above. In the termination area 75, for the purpose of making gate contact 55, the polysilicon runner 85 in the trench 80, extended from the gates 40 in core cell area, are specially formed to rise above the surface level of the trench 80 to form a poly-contact-pad 88. The poly-contact-pad 88 is formed to provide greater contact area for making electric contact with gate contact metal 55. However, in forming the gate-contact-pad 88, an insulating oxide layer, e.g., a gate oxide layer, is required to form around the edges and corners of the trench 80 to insulate the poly 85 from the p-body region 25. The oxide layer 90 grown around the edges and corners of the trench 80 generates a special problem which often adversely affect the reliability of the DMOS device. The oxide layer 90 grown around the edges and corners of the trench 80 are usually grown with non-uniform and reduced thickness and poor quality due to the special edge and corner configurations. The oxide layer 90 grown around the corners is generally worse in quality than that around the edges because of a three-dimensional effect as compared to the two-dimensional effect around the trench edges. As a result, weak insulation around the trench edges and corners becomes a major cause of early breakdown. The corner and edge points 90 thus become vulnerable weak point to the DMOS devices.

Bulucea et al. disclose in a U.S. Pat. No. 5,072,266, entitled "Trench DMOS Power Transistor with Field-Shaping Body Profile and Three-Dimensional Geometry" (issued on Dec. 10, 1991), a power MOSFET device which is formed with a polygon-shaped trench in which the gate is positioned in order to suppress the oxide dielectric breakdown near the gate. A shaped deep-body junction which partly lies below the trench bottom is employed to force the voltage breakdown away from the trench surface and into the bulk of the semiconductor material.

Bulucea et al. disclose a device structure and fabrication method to achieve a controlled bulk semiconductor breakdown. The object of prevent a trench surface breakdown by controlling a bulk breakdown is achieved by taking advantage of the position of the gate in the trench and by using a two dimensional "field-shaping" doping profile including a central deep p+ layer that is laterally adjacent to a p body layer and vertically adjacent to an epitaxial layer of appropriate thickness. The device disclosed by this invention provides improvement of design and fabrication for the DMOS cells in the core cell area. Bulucea et al., however, do not provide a device structure or fabrication method to resolve the difficulties caused by the weak spots near the trench corners and edges in the termination area.

In another U.S. Pat. No. 5,316,959 entitled "Trenched DMOS Transistor Fabrication Using Six Masks", Kwan et al. disclosed a fabrication method to form a trenched DMOS with improved processing sequence such that the number of masks required for fabrication is reduced. However, the trenched DMOS device as disclosed by Kwan et al. does not address the difficulties of early breakdown caused by the poor quality of the gate oxide overlaying the trench edges and corners due to the problems in growing the oxide layer over these spots where two-dimensional and three-dimensional effects adversely affect the uniformity and thickness of the oxide layer. The DMOS device disclosed by this patent has a further limitation that the poly-ring in the termination area with a floating potential may cause the problem of break-down voltage instability.

Therefore, there is still a need in the art of power device fabrication, particularly for DMOS design and fabrication, to provide a structure and fabrication process that would resolve these difficulties.

SUMMARY OF THE PRESENT INVENTION

It is therefore an object of the present invention to provide an improved trenched DMOS structure, and fabrication process to overcome the aforementioned limitations of early breakdown in the gate oxide caused by the two-dimensional and three-dimensional effects over the trench edges and corners as encountered in the prior art.

Specifically, it is an object of the present invention to provide an improved trenched DMOS structure and fabrication method wherein a first improved structure is applied by opening a gate window at the end of the trench stripes along the poly fingers whereby, by removing the poly layer in the gate window areas above the end of the trench stripes, the three-dimensional effects caused by the gate oxide overlaying the trench corners is eliminated and the difficulties caused by the weak points in the oxide layer over trench corners are resolved.

Another object of the present invention is to provide an improved trenched DMOS structure and fabrication method where a second improved structure is applied by forming a terminal gate-contact runner and by opening gate window on the terminal gate-contact runner such that the difficulties of breakdown weak points can be resolved.

Another object of the present invention is to provide an improved trenched DMOS structure and fabrication process where a third improved structure is applied by forming an extra-wide terminal gate-contact runner and by forming gate contact window above the extra-wide terminal gate-contact runner for gate-contacts to be formed therein such that the need for raising the gate poly above the trench is eliminated and the difficulties of breakdown weak points and poor gate contacts can be resolved.

Another object of the present invention is to provide an improved trenched DMOS structure and fabrication process where a simplified fabrication method is employed, when the extra-wide gate runner is implemented, to reduce the number of masks required for manufacturing the DMOS transistors, because the need of poly mask is eliminated, and thus reduce the cost of manufacture.

Briefly, in a preferred embodiment, the present invention includes a DMOS device which includes a core cell area comprising a plurality of trenched DMOS cells and a termination area for forming gate contacts therein. The trenched DMOS cells include a plurality of trenched poly-fingers extending from trenched poly-gates of the DMOS cells to the termination area thus forming a trench-end region forming a plurality of trench corners therein. The DMOS transistor further includes a plurality of poly windows above the trench corners with an overlaying poly-layer above the trenched corners near the poly-fingers extended thereto removed for forming the poly windows, whereby the overlaying poly layer formed over a plurality of the trench corners in the trench-end region are removed and a plurality of breakdown weak points of the DMOS are eliminated. In a preferred embodiment, the trench-end region includes a plurality of trench end-points thus forming a plurality of trench corners therein, wherein the poly windows are formed above the trench end-points over the trench corners. In another embodiment, the trench-end region includes a connecting end-trench which is connected to each of the poly-fingers extended thereto thus forming a plurality of trench corners therein and the poly windows are formed above the trench corners near the connecting end-trench.

In an alternate preferred embodiment, the present invention discloses a DMOS transistor includes a core cell area comprising a plurality of trenched DMOS cells and a termination area for forming gate contacts therein, wherein the trenched DMOS cells include a plurality of trenched poly-fingers extending from trenched poly-gates of the DMOS cells to the termination area thus forming a trench-end region. The DMOS transistor further includes a extra-wide trenched terminal runner in the trench-end region formed with trenched poly and connected to the poly-fingers extended thereto. The DMOS transistor further includes at least a contact window formed above the extra-wide terminal runner for forming a gate contact therein for electrically connected to the poly-fingers. In this embodiment, an overlaying poly-layer above the trenched poly-fingers is removed in the termination area and a plurality of breakdown weak points of the DMOS are eliminated. In a specific embodiment, the extra-wide trenched terminal runner are formed with a width ranging from two to four microns (2.0–4.0 μm).

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 3A:
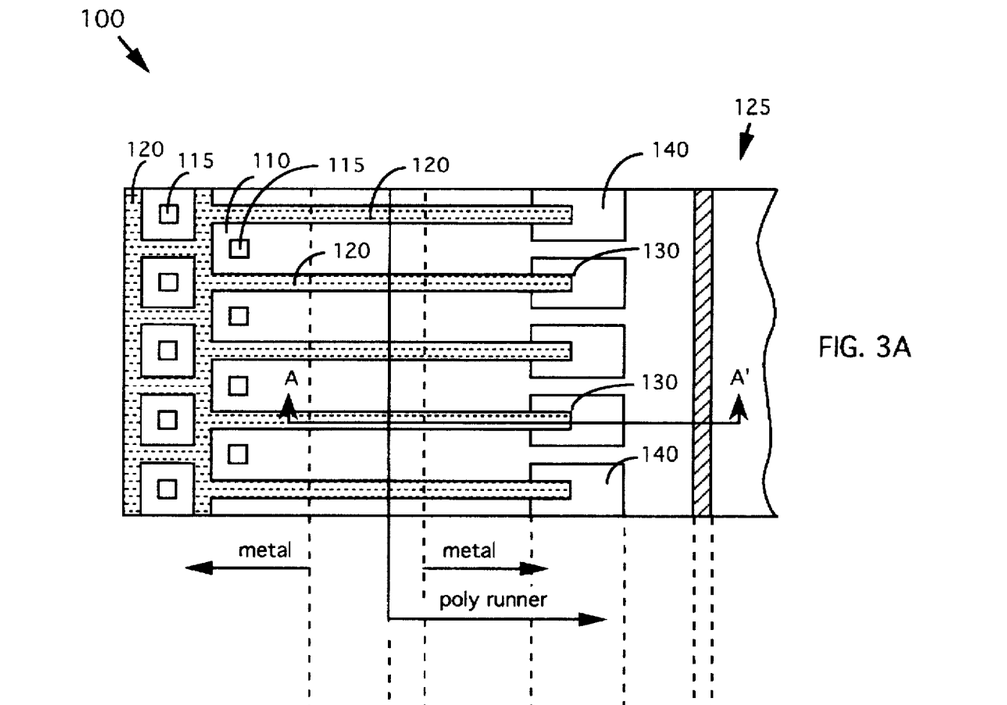
FIGS. 3A and 4A show top views of the improved DMOS structures near the termination area wherein the integrity of the gate oxide is improved when the gate windows are open to eliminate the gate oxide overlaying trench corners.
Figure 3B:
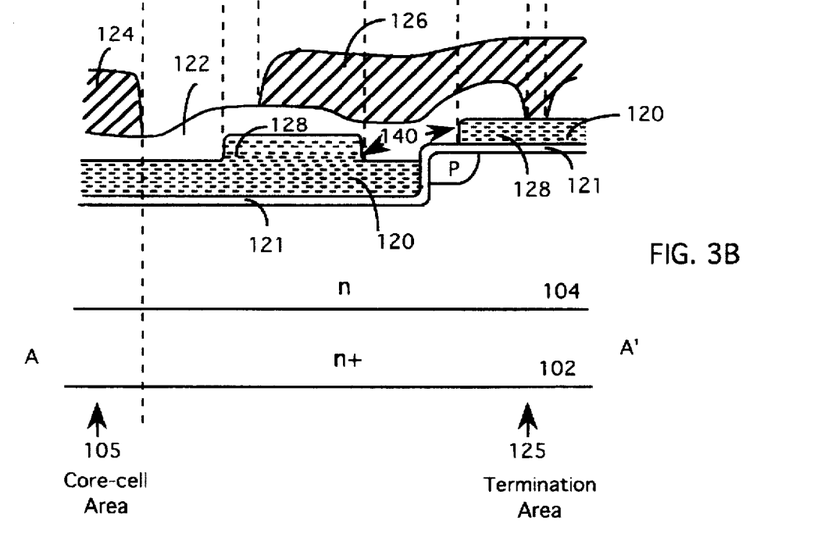
FIGS. 3B, and 3C show two cross sectional views of FIG. 3A, and FIGS. 4B and 4C show two cross sectional views of FIG. 4A to illustrate the device structure of the improved DMOS transistors of this invention.
Figure 3C:
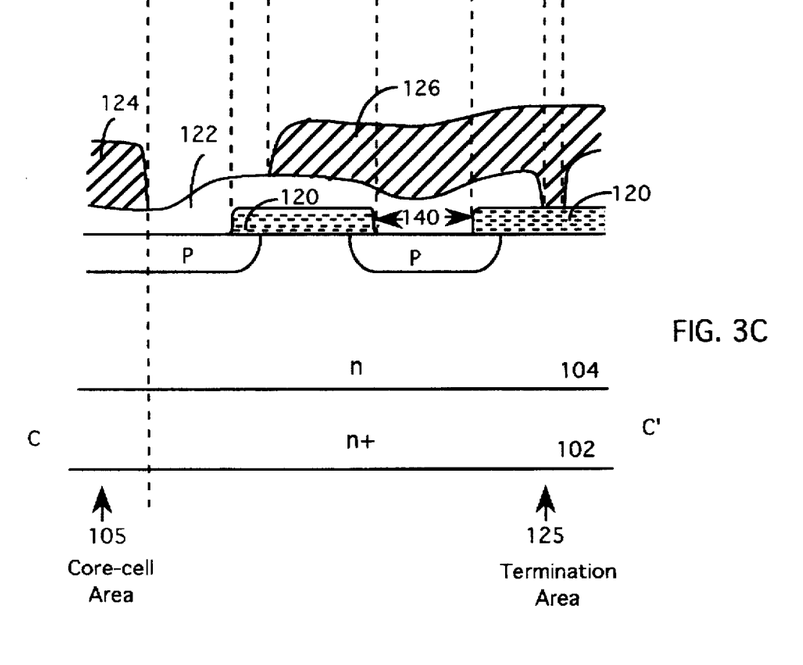

FIG. 3A shows the top view of a first preferred embodiment of a DMOS transistor 100 of the present invention. The device 100 includes a core cell area 105 which includes a plurality of DMOS cells 110 each has a source contact 115 and a polysilicon gate 120 formed in the trench. The poly gate 120 in the trench formed as "poly fingers" extend from the core cell area 105 to a termination area 125. In the termination area 125 a plurality of gate windows 140 are opened. These windows are opened by applying special configured poly mask to remove the polysilicon layer from these windows. FIGS. 3B and 3C show the cross sectional views of the DMOS device 100 along the line A–A' and C–C' respectively. The DMOS transistor 100 is formed on top of an epi-layer supported by a substrate 102. A trench is formed and a ploy-layer 120 is deposited with a gate oxide layer insulating the poly layer 120 from the epi-layer 104. A poly mask is then employed to remove the polysilicon from the top above the trench in the core cell area 105. The poly-mask is also provided with a plurality of windows in the termination area 125 near the end point of the trench stripes 130 to remove the poly thus forming the windows 140. The transistor 100 also includes a PSG or BPSG layer 122 formed on top of the poly layer 120 and the window 140. Source contact 124 and gate contact 126 are then formed with by the use of contact mask wherein the gate contact 126 are in electric contact with the gate runner 128 in the termination area 125.

With the poly windows 140 opened near the end points 130 of the trench stripes, the poly layer 120 is not raised above the trench near the end point 130. The three dimensional effects in forming the gate oxide layer 121 underneath the gate poly 120 at the trench corners near the end points 130 are eliminated. The early breakdown problems which most frequently occurs at the trench corners are therefore resolved by this novel structure where the poly windows 140 remove the poly layer above the end points 130 of the trench stripes and the poly layer 120 is not configured to overlay the trench corners. The traditional weak points in the gate oxide at the trench corners are thus entirely removed.

Figure 4A:
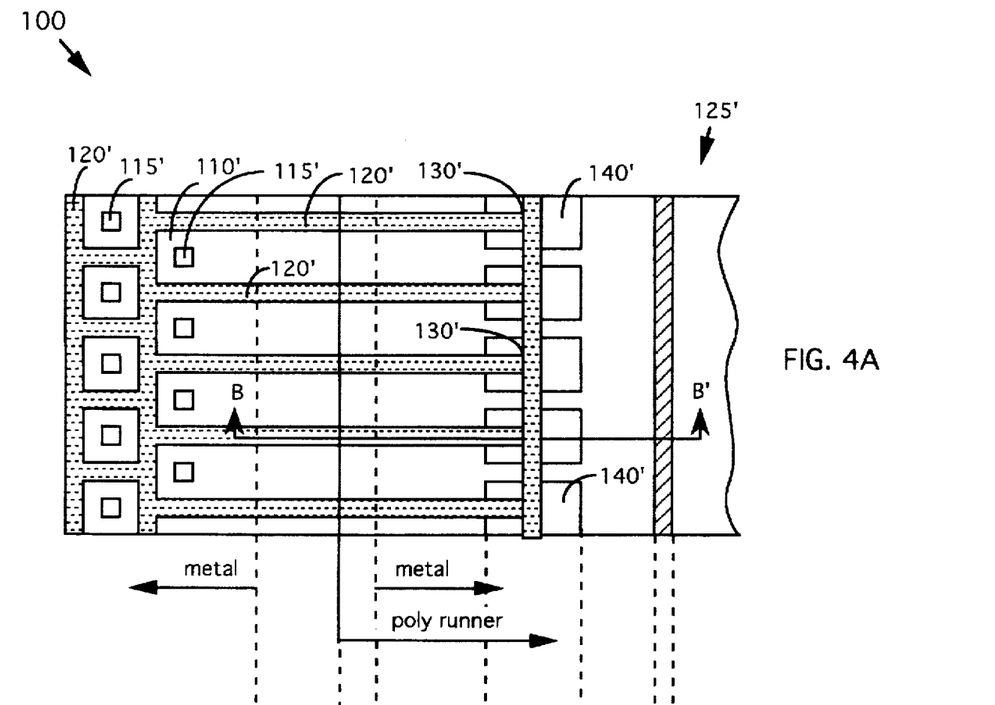
Figure 4B:
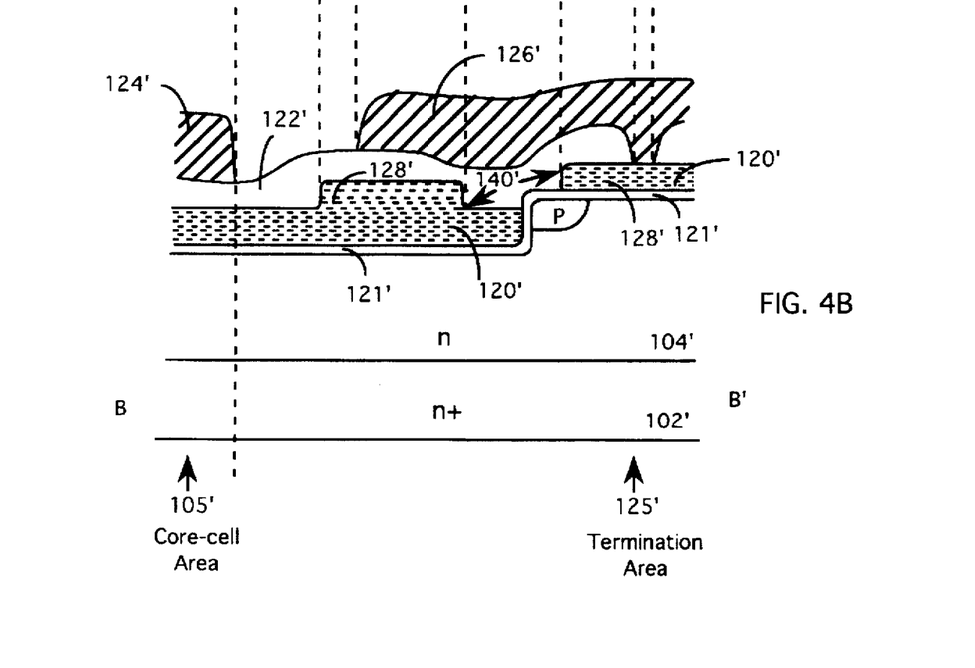
Figure 4C:
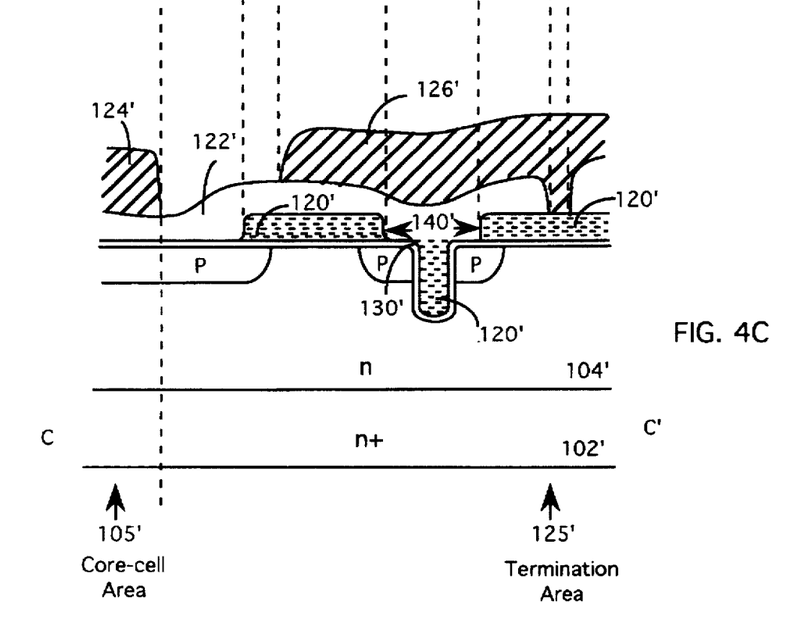

Please refer to FIG. 4A for a top view of another preferred embodiment of the present invention for a DMOS 100' where the device structure and topology are almost totally identical to the DMOS device 100 as that shown in FIG. 3 except that the topology of the poly fingers in the termination area 125' are configured differently from that of the DMOS 100. Instead of forming a plurality of termination points, the poly fingers are connected to a "end-point runner" 130' formed as a trench perpendicular to the poly trenches 120' extended from the core cell area 105'. Similar to that shown in FIG. 3, contact windows 140' are opened on top of the end-point runner 130'. Referring to FIGS. 4B and 4C which are the cross sectional views of the DMOS device 100' along the lines B-B' and D-D' respectively. The cross sectional view shown in FIG. 4B is identical to that shown in FIG. 3B. Again, the poly layer 120' is removed from the top of the trench and the end-point of the gate runner 130' in the areas of the gate windows 140'. The problems of early breakdown in the oxide when such oxide layer is formed to overlay the trench corners are eliminated in this novel device structure because the poly layer is removed in the gate windows 140.

In summary, the present invention includes a DMOS device 100 which includes a core cell area 105 comprising a plurality of trenched DMOS cells 110 and a termination area 125 for forming gate contacts therein. The trenched DMOS cells 110 include a plurality of trenched poly-fingers 120 extending from trenched poly-gates of the DMOS cells 110 to the termination area 125 thus forming a trench-end region forming a plurality of trench corners therein. The DMOS transistor 100 further includes a plurality of poly windows 140 above the trench corners with an overlaying poly-layer above the trenched corners near the poly-fingers 120 extended thereto removed for forming the poly windows 140, whereby the overlaying poly layer formed over a plurality of the trench corners in the trench-end region are removed and a plurality of breakdown weak points of the DMOS are eliminated. In a preferred embodiment, the trench-end region includes a plurality of trench end-points 130 thus forming a plurality of trench corners therein, wherein the poly windows 140 are formed above the trench end-points 130 over the trench corners. In another embodiment, the trench-end region includes a connecting end-trench 130' which is connected to each of the poly-fingers 120 extended thereto thus forming a plurality of trench corners therein and the poly windows 140' are formed above the trench corners near the connecting end-trench 130'.

Figure 5:
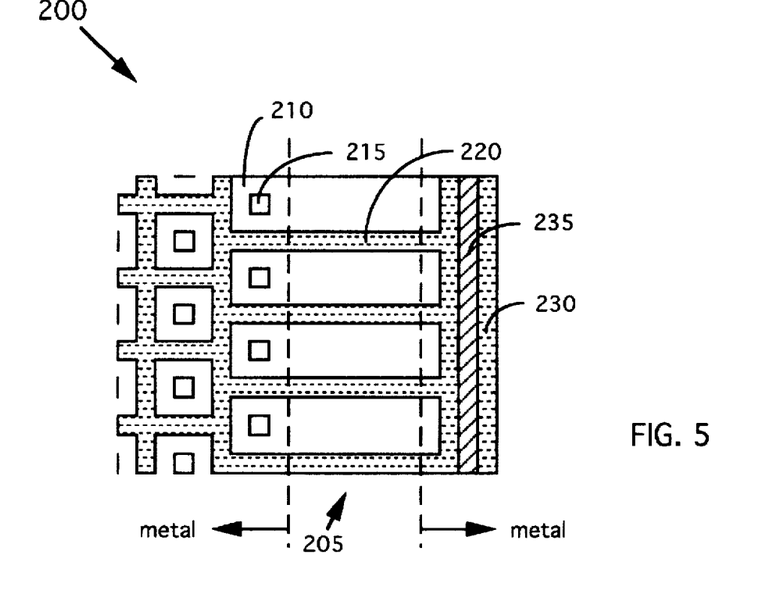
FIGS. 5 to 6 show a top views of improved DMOS structure near the termination area wherein the integrity of the gate oxide is improved when an extra-wide gate runner is formed in the termination area to eliminate the gate oxide overlaying trench corners and edges by depositing the gates contact directly on the extra-wide gate contact runner.
Figure 6:
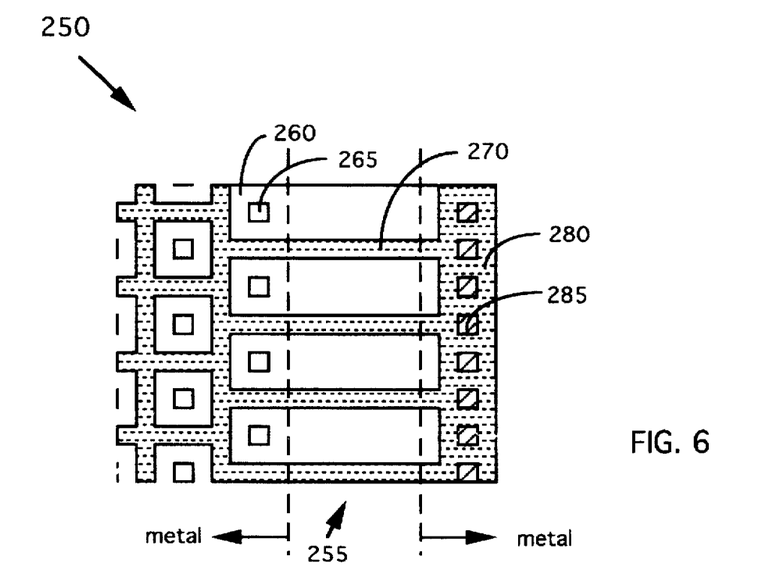

FIGS. 5 and 6 show the top view of two different DMOS devices 200 and 250 respectively of the present invention.

The core cell area 205 and 255 include the cells 210 and 260 with a source contact 215 and 265 contained therein respectively are identical the devices shown in FIGS. 3 and 4. For making external electric connection, the polysilicon gates 220 and 270 are formed in the trenches with the trenches extend to the termination area. The device 200 and 250 further include an extra-wide termination gate runner 230 and 280 respectively. The extra-wide termination gate runner 230 and 280 are formed as a gate runner connected to the extend "ploy fingers" extending to the termination area wherein the extra-wide termination gate runner 230 and 280 are perpendicular to the extending poly fingers for keeping contact with each of these fingers. The extra-wide termination runner 230 and 280 are wider than the poly fingers. The poly fingers extending from the core cell area 205 and 255 to the termination area are typically have a width of approximately one-micron (1.0 µm). The extra-wide termination runner 230 and 280 are formed with a width of approximately twice to three times as wide, e.g., two to four microns (2.0–4.0 µm). For the purpose of making gate contacts to provide external connection for the gate, a contact mask is shaped to make contact windows, i.e., contact windows 235 and 285, right on top of the extra-wide termination runner 230 and 280 respectively. In FIG. 5, the contact window 235 is made as an elongate window while in FIG. 6, the contact windows are formed as a plurality of square open windows 285. A designer has flexibility to select either one of these topologies. The use of the extra-wide termination runners 230 and 280 provide several advantages. First, the integrity of gate oxide is further improved because the poly layer 220 is not required to overlay the trench corners and the trench edges. In this preferred embodiment, the poly layer is totally removed above the trench. Therefore, the undesirable two-dimensional and three-dimensional effects in forming an oxide layer underneath the poly layer 220 over a trench edge or trench corner are eliminated in a DMOS transistor implemented with this novel configuration. The potential weak points of early breakdown in the gate oxide over the trench edges or corners are completely removed in this improved DMOS structure. Secondly, with the extra-wide termination runner 230 and 280, extra cost savings of fabrication can be achieved because the requirement for applying a poly mask is now eliminated. The polysilicon layer formed above the trench can be removed entirely without requiring to block a certain areas to keep the poly layer above the trench since the gate contacts can be formed directly on the extra-wide termination runner 230 and 280 now with this novel transistor structure.

In summary, the present invention also discloses a DMOS transistor 200 includes a core cell area 205 comprising a plurality of trenched DMOS cells 210 and a termination area 225 for forming gate contacts therein, wherein the trenched DMOS cells 210 include a plurality of trenched poly-fingers 220 extending from trenched poly-gates of the DMOS cells 210 to the termination area 225 thus forming a trench-end region. The DMOS transistor further includes a extra-wide trenched terminal runner 230 in the trench-end region formed with trenched poly and connected to the poly-fingers 220 extended thereto. The DMOS transistor 200 further includes at least a contact window 235 formed above the extra-wide terminal runner for forming a gate contact therein for electrically connected to the poly-fingers 220. In this embodiment, an overlaying poly-layer above the trenched poly-fingers 220 is removed in the termination area 225 and a plurality of breakdown weak points of the DMOS are eliminated. In a specific embodiment, the extra-wide trenched terminal runner 230 are formed with a width ranging from two to four microns (2.0–4.0 µm).

Figure 7:
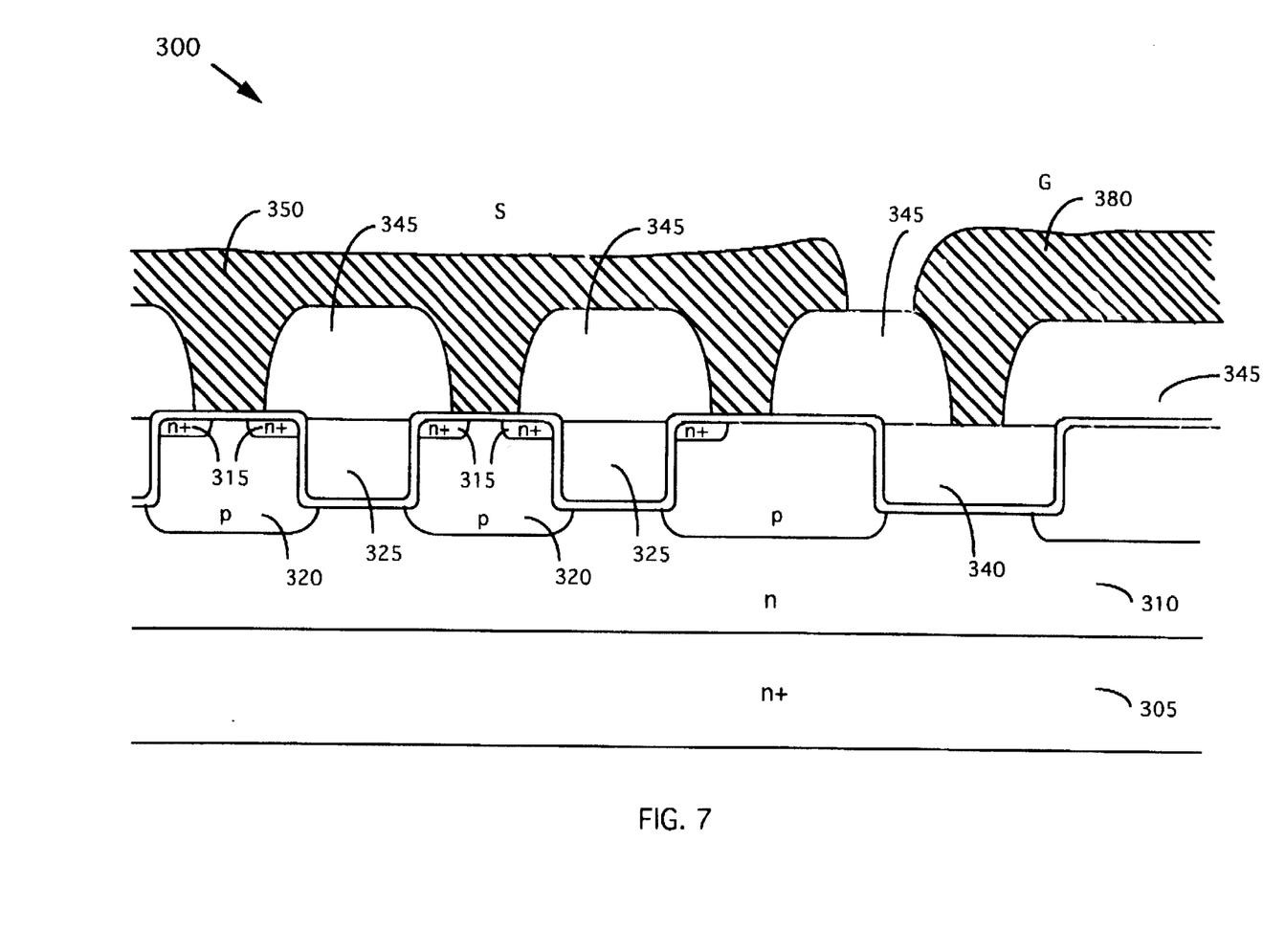
FIG. 7 is a cross sectional view of the improved DMOS device of the present invention wherein the difficulties of the breakdown weak points are resolved.

Please refer to FIG. 7 for a cross sectional view of a DMOS transistor 300. The DMOS transistor 300 is formed on a N+ substrate 305 supporting a N epi-layer 310 thereon. The DMOS transistor 300 includes a plurality of cell in the core cell area each having a vertical pn-junction region with a N+ source region 315 formed on top of a deeper p-body region 320. The DMOS transistor 300 further includes a gate 325 formed with polysilicon layer deposited in a trench formed in the epi-layer 310. A current path is established from the source 315 via a channel formed in the p-body along the gate 325 and extend to the drain in the N+ substrate 305. In the termination area, an extra-wide termination runner 340 which is in electrical communication with the gate 325 and formed with great width including polysilicon deposited in an extra-wide trench, e.g., a trench with a width of about two to three microns. A PSG or BPSG insulation layer 345 is formed on top of the entire active area. A contact mask is then applied to open a plurality contact windows on top of the sources 315 and the p+ region 335 in the core cell area for forming the source contact 350. Contact windows are also opened in the termination area above the extra-wide termination runner 340 for forming gate contact 360. Clearly shown in this cross-sectional view of the DMOS transistor 300 is the elimination of gate oxide layer in the corners or edges around the trenches. The gate contact 360 is formed directly on top of the extra-wide termination runner 340 to assure good contact are formed and attached securely thereon. Additional advantage is provided by the use of the extra-width of the extra-wide termination runner 340. Under the circumstance that the termination runner is formed with a regular width, e.g. one-micron, due to the limitation of the etching processes in opening the gate contact window on a PSG or a BPSG layer 345, extra carefulness is required that the gate contact window is limited to the area above the gate poly only. When the etch process is not carefully performed, lateral extension of the etching can inadvertently penetrate into the p-body region 320 and create an undesirable short circuit condition. By making the terminal runner 340 extra wide, in addition to the benefit that good gate contacts are formed, the concern for inadvertently forming a short circuit configuration between the gate contact 360 and the p-body 320 can be resolved. Furthermore, extra cost savings are achieved because the requirement of a poly mask is now eliminated when the poly layer above the trench over the entire area can be removed when the extra-wide termination gate runner 340 in the trench provides contact windows for making the gate contacts 380 right above the extra-wide termination gate runner 325.

Figure 8A:
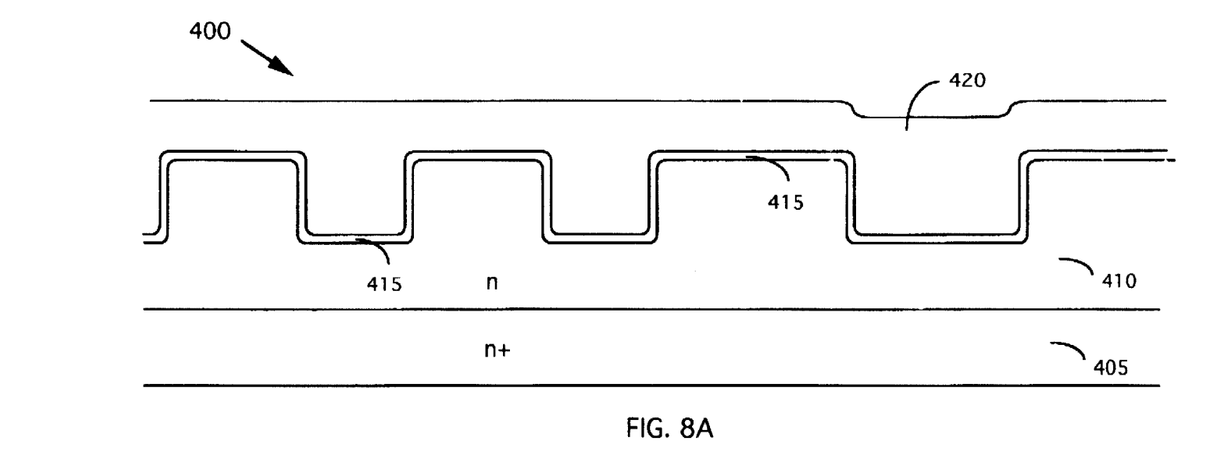
FIGS. 8A to 8H show the processing steps of manufacturing a DMOS device of FIGS. 3 to 7.
Figure 8B:
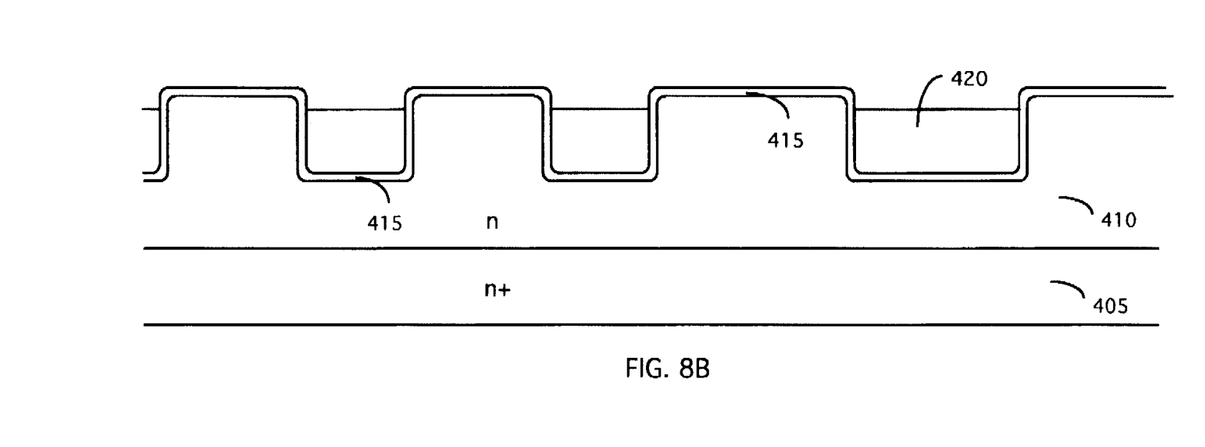

Please refer to FIGS. 8A to 8H for the processing steps for manufacturing the power DMOS device 400 described above. As shown in FIG. 8A, the processing steps begins by first growing a N epitaxial layer 410 with a resistivity ranging from 0.1 to 1.0 ohm-cm on top of a N+ substrate 405. The substrate has a resistivity of 0.001 to 0.007 ohm-cm. The thickness and the resistivity of the epitaxial layer 410 depend on the device requirements for the on-resistance and breakdown voltage. In a preferred embodiment, the thickness of the epi-layer 410 is about three to twenty microns (3–20 μm). A photoresist is employed as a trench mask A trench etch process, which is a dry anisotropic etch process, is applied to form trenches of 1.0 to 2.0 microns wide and 1.0 to 2.0 micron in depth. A sacrification oxidation process is applied which can be either a dry or wet oxidation process conducted at a temperature of 900°–1100° C. to form oxide layer of approximately 300–2000 Å in thickness which is followed by a sacrification oxide etch process. A gate oxide layer 415 is then formed by a gate oxidation process which can be a wet or dry oxidation process carried out at a temperature of 800° to 1100° C. to form a layer of thickness in the range of 200 to 1,000 Å. A poly deposition process is performed to deposit a poly layer 420 ranging from 1.5 to 3.0μ in thickness. A planarization etch is performed to form a planar surface by etching a top layer to 0.2–0.5μ from the deposited poly. A POCL$_3$ doping process is carried out at 950° C. to make the poly layer 420 have a sheet resistance of 20–40 ohm/cm². Referring to FIG. 8B, where a poly etch is carried out to dry etch the poly layer 420 till the top surface is removed with the end-point detection to terminate the etch process when the polysilicon layer above the trench is removed.

Figure 8C:
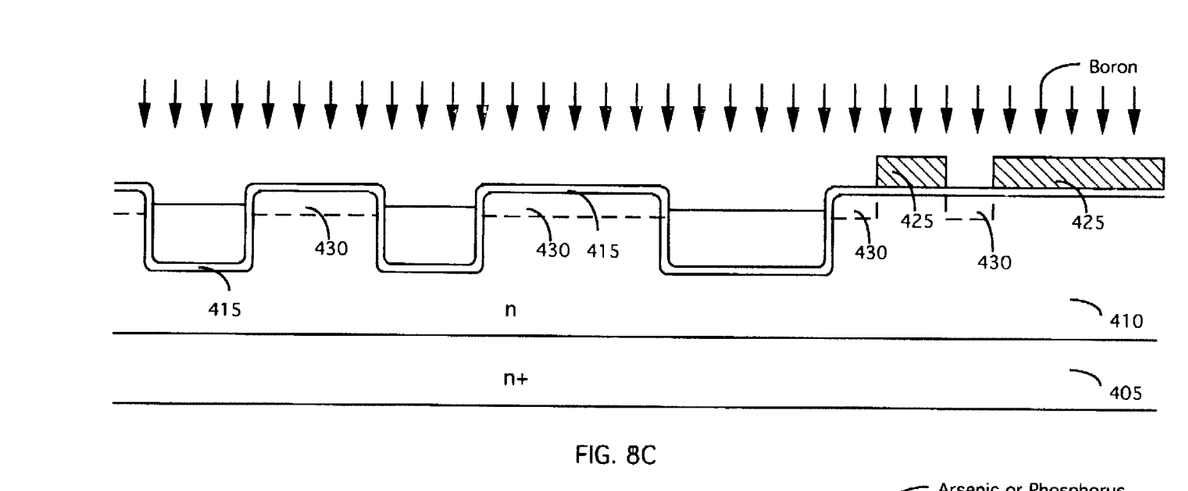
Figure 8D:
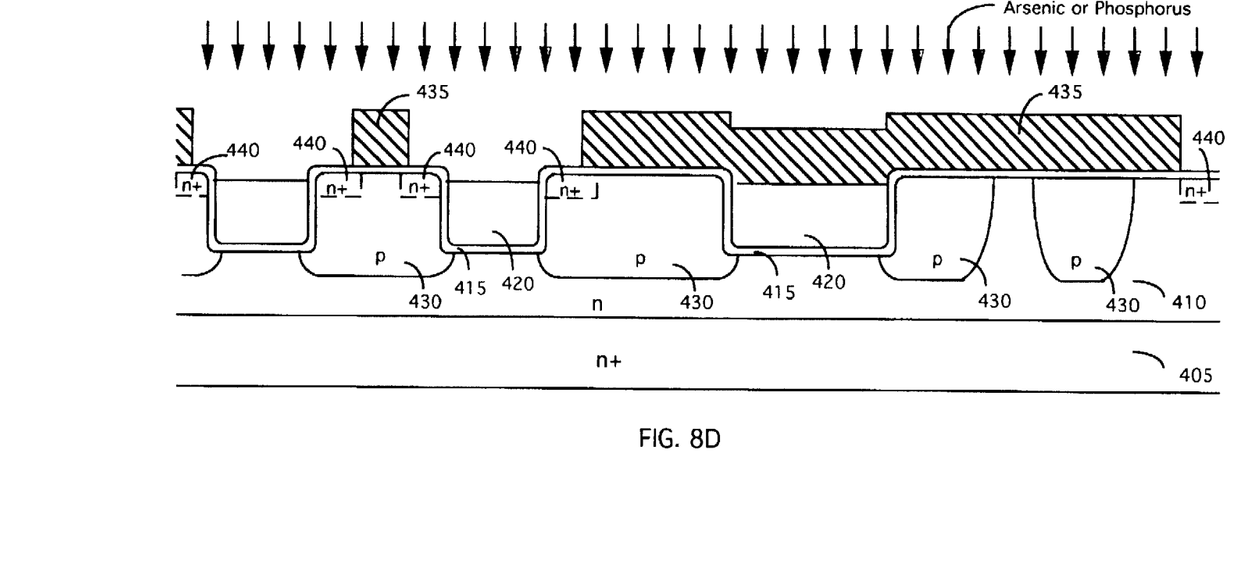
Figure 8E:
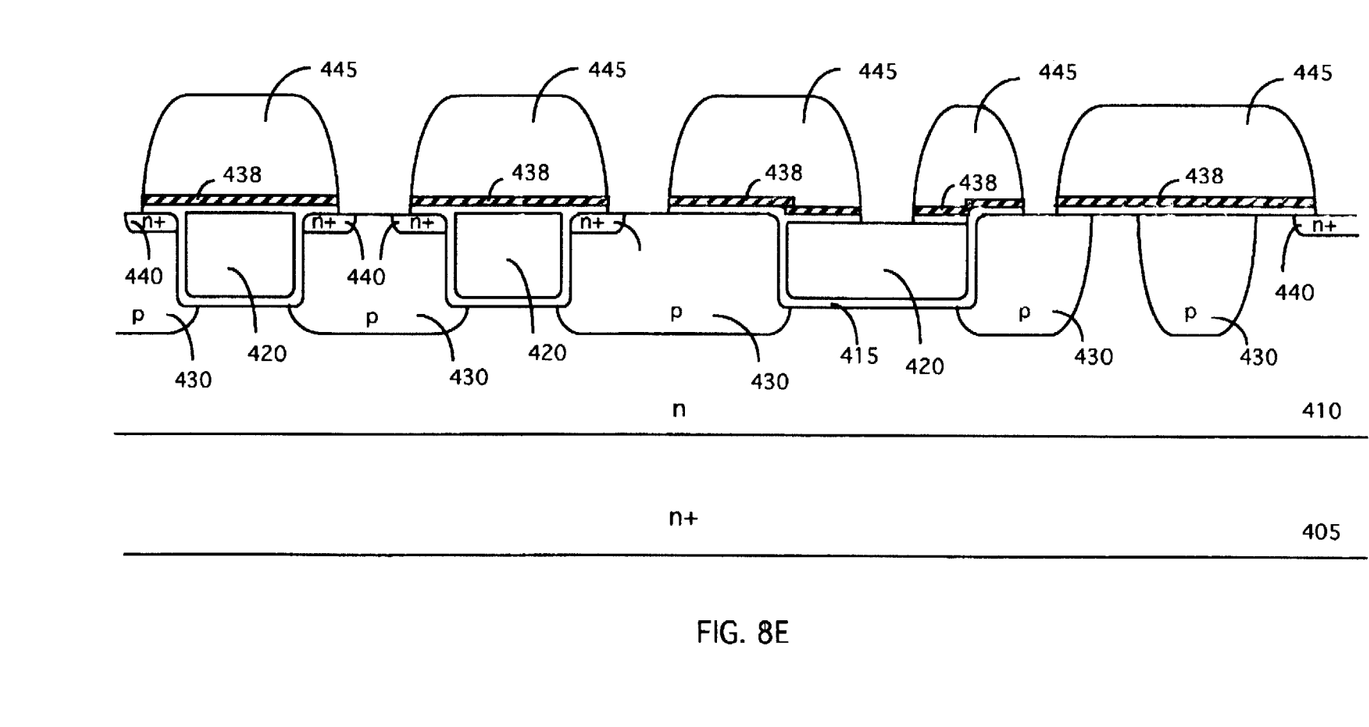
Figure 8F:
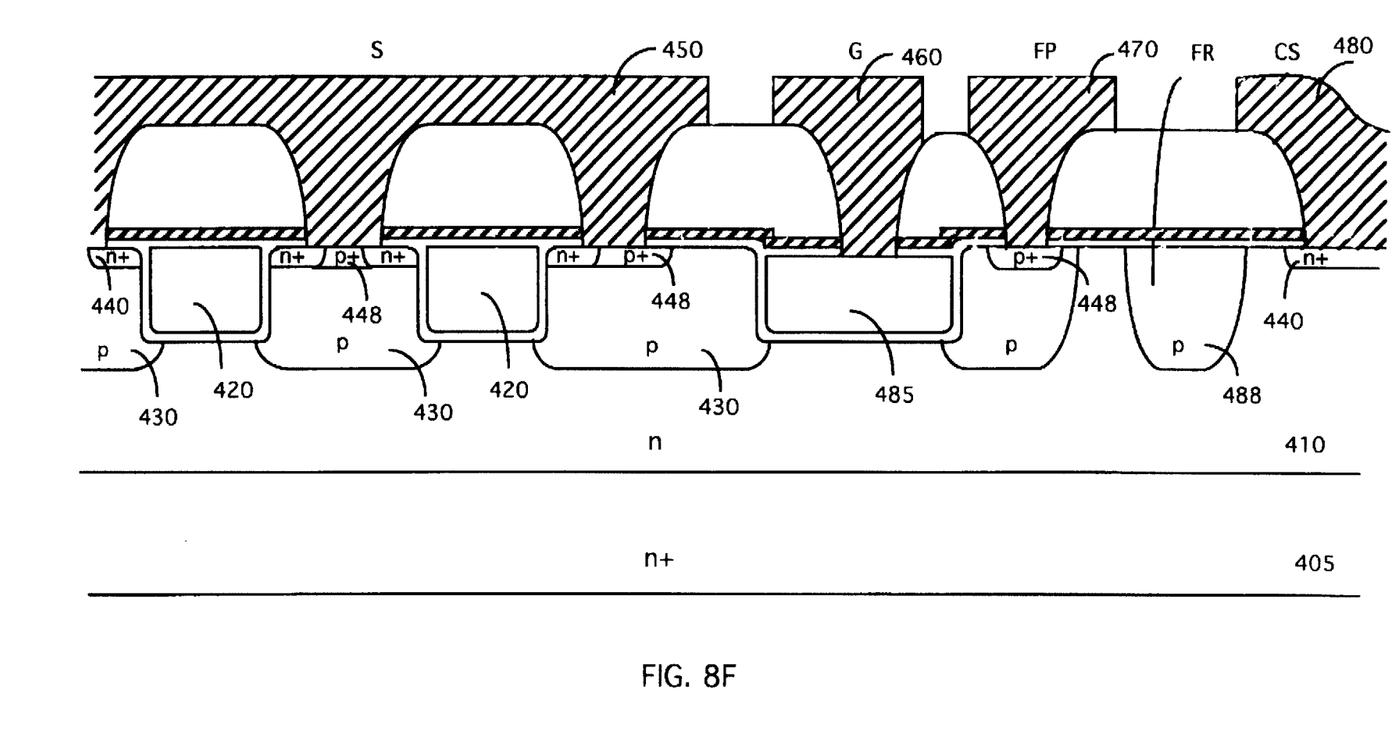
Figure 8G:
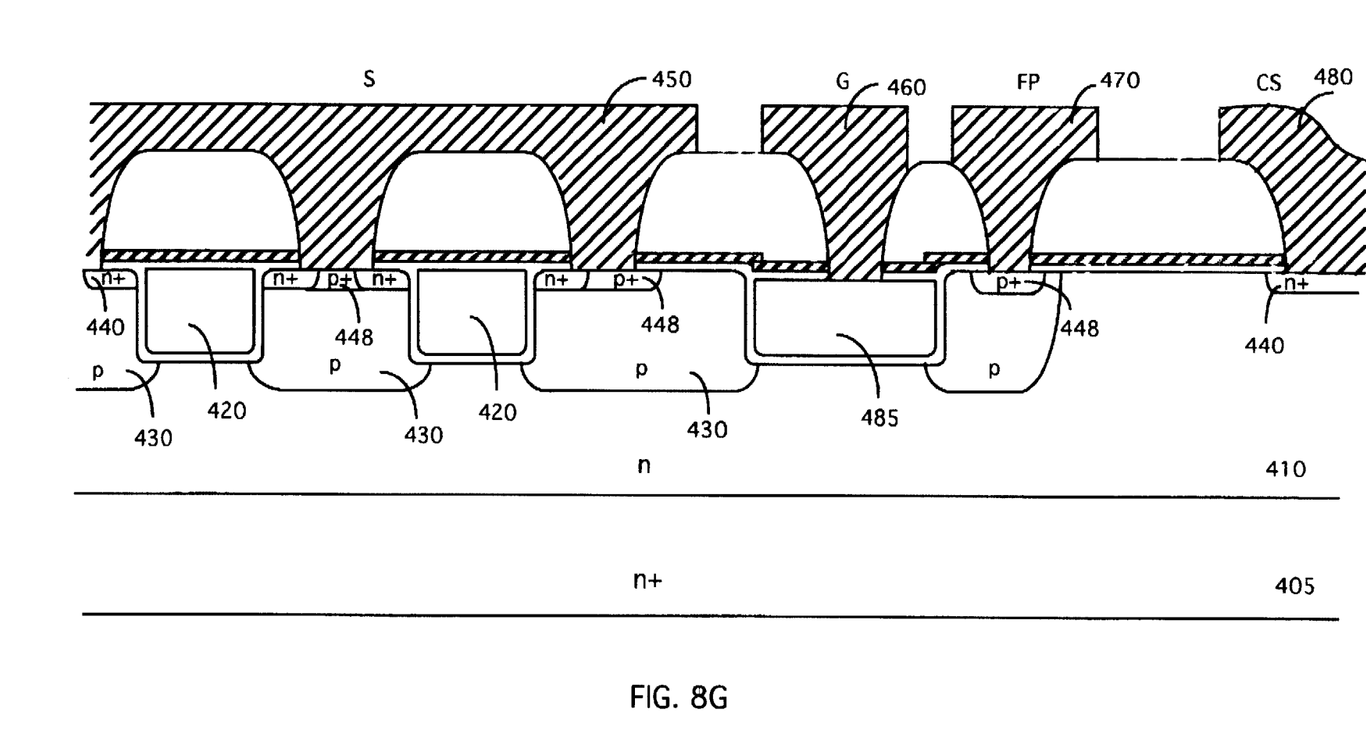
Figure 8H:
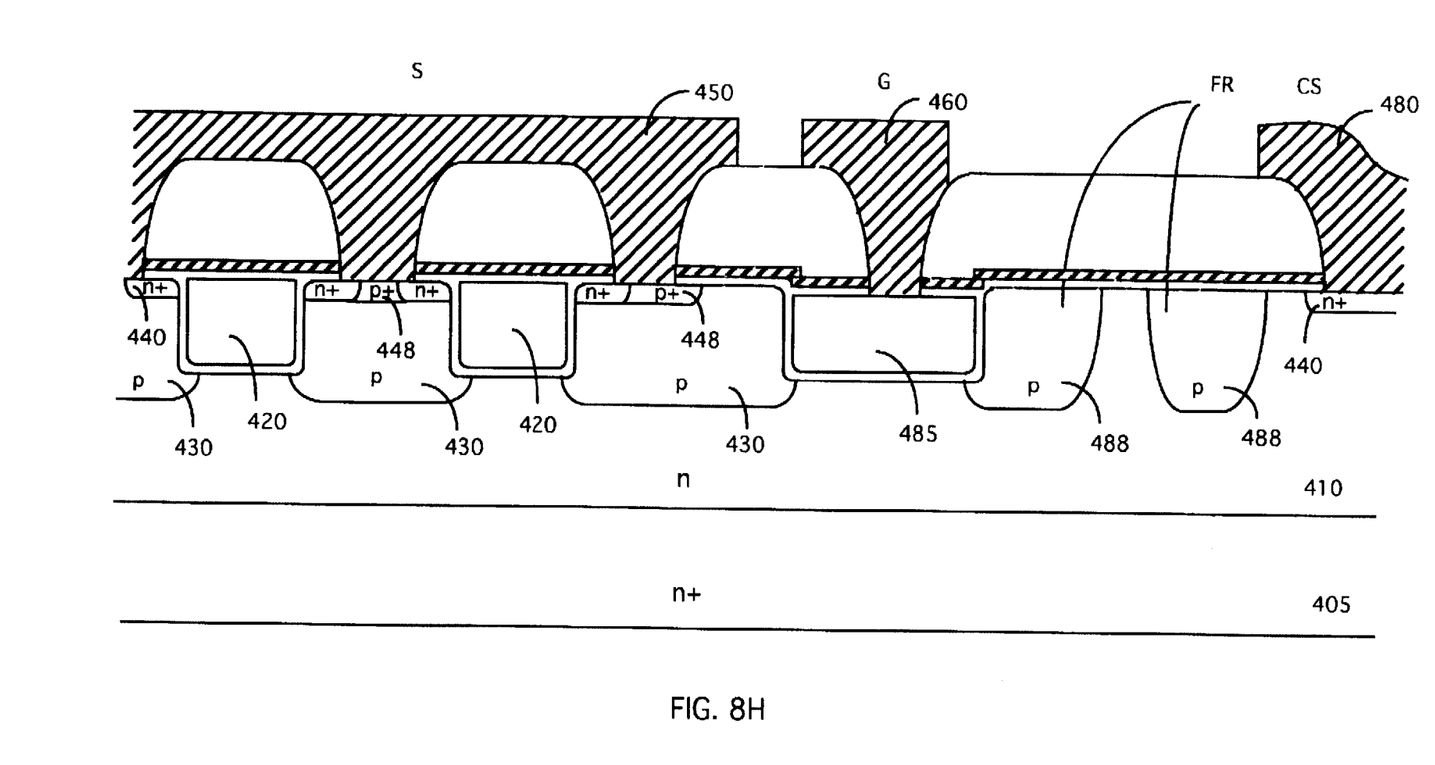

Referring to FIG. 8C, where a p-body mask 425 is applied to perform a p-body implant with boron ions at 30–100 Kev with an ion beam of $2 \times 10^{13}$ to $2 \times 10^{14}$/cm² flux density to form the p-body region 430. The resist 425 is then stripped. Referring to FIG. 8D, a p-body diffusion process is then carried out at an elevated temperature of 1,000°–1,200° C. for ten minutes to three hours to increase the depth of the p-body region 430 to 1.0–2.0μ. A N+ block mask 435 is applied to carry out an N+ implant to form the N+ region 440. The N+ implantation is carried out with an arsenic or phosphorus ion beam at an energy of 40–100 Kev and ion flux density of $5 \times 10^{15}$ to $1 \times 10^{16}$/cm² then the resist, i.e., the N+ blocking mask 435, is stripped. Referring to FIG. 8E, the N+ source regions 440 are driven into desired junction depth ranging from 0.2 to 1.0μ by a diffusion process at a temperature of 900°–1000° C. for 10 minutes to two hours. A low pressure chemical vapor deposition (LPCVD) nitride layer 438 is formed over the top surface. A BPSG or PSG is deposited to form a layer 445 of approximately 5000–15,000 Å in thickness. A BPSG flow or PSG densification process is performed at 900°–950° C. for thirty minutes to one hour. A contact mask is applied to perform a dry etch process to define the contacts windows in order to be ready for making source and gate contacts. A blank boron implant with an ion beam of 20–50 Kev and ion flux of $10^{15}$ to $1 \times 10^{16}$/cm² is carried out. The p+ region is activated at 900°–950° C. in an oxidation or inert gas ambient. Referring to FIG. 8F, a metal deposition process is carried out to form an overlaying metal layer. The final DMOS transistor 400 is completed by applying a metal mask to pattern the source contact 450, the gate contact 460, the field plate 470 and the channel stop (CS) 480. In FIG. 8F to 8H, an extra-wide termination gate-runner 485 is formed. In FIG. 8F, the floating ring (FR) region 488 and a channel step 480 are formed. In FIG. 8G, the field ring FR 488 is not required because different breakdown voltage requirement. In FIG. 8H, the field plate 470 is not required as a series of floating rings 488 and a channel are employed for another breakdown voltage requirement. A passivation layer is not required because the mobile ions are totally blocked by the LPCVD nitride layer 438 from entering the transistor. Additionally cost savings are achieved when compared with a conventional DMOS transistor because he fabrication of this DMOS 400 does not require the use of a pad mask. While in contrast, in the process of fabricating a conventional DMOS, a pad mask must be applied to pattern the passivation layer.

Therefore, the present invention provides an improved trenched DMOS structure, and fabrication process to overcome the difficulties of the early breakdown in the gate oxide caused by the two-dimensional and three-dimensional effects over the trench edges and corners as encountered in the prior art. Specifically, a first improved structure is provided by opening a gate window at the end of the trench stripes along the poly fingers whereby, by removing the poly layer in the gate window areas above the end of the trench stripes, the three-dimensional effects caused by the gate oxide overlaying the trench corners is eliminated and the difficulties caused by the weak points in the oxide layer over trench corners are resolved. A second improved structure is provided by forming a terminal gate-contact runner and by opening gate window on the terminal gate-contact runner such that the difficulties of breakdown weak points can be resolved. A third improved structure is provided by forming an extra-wide terminal gate-contact runner and by forming gate contact window above the extra-wide terminal gate-contact runner for gate-contacts to be formed therein such that the need for raising the gate poly above the trench is eliminated and the difficulties of breakdown weak points and poor gate contacts can be resolved. Additionally, a simplified fabrication method is disclosed, when the extra-wide gate runner is implemented, the number of masks required for manufacturing the DMOS transistors is reduced because the need of poly mask is eliminated, and thus a cost saving of manufacture is also achieved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A DMOS device includes a core cell area comprising a plurality of trenched DMOS cells and a gate metal area for forming a gate metal therein near a termination area disposed on an outer peripheral of said DMOS device, wherein said DMOS device include a plurality of trenched poly-fingers extending from trenched poly-gates of said DMOS cells to said gate metal area provided with a trench-end region defining a plurality of trench corners therein, said DMOS device further comprising:

an above-trench poly-runner layer covering said gate metal area including said trench-end region and said above-trench poly-runner layer is connected to said poly-fingers wherein said above-trench poly runner layer defining a plurality of gate contact openings provided for depositing a metal therein to contact said trenched poly-fingers and said trenched gates; and a gate contact opening is disposed above each of said trench corners whereby none of said trench corners being covered by said above-trench poly-runner layer.

2. The DMOS transistor as recited in claim 1 wherein:

said poly fingers extending to and terminating at said trench-end region thus defining a plurality of trench ends therein, wherein a gate contact opening is disposed above each of said trench end.

3. The DMOS transistor as recited in claim 1 wherein:

said trench-end region includes a gate-runner connected to an end point of said poly-fingers thus defining a plurality of trench corners therein, wherein a gate contact window is disposed above each of said trench corners whereby none of said trench corners being covered by said above-trench poly-runner layer.

4. A trenched DMOS device with no above trench poly layer includes a core cell area comprising a plurality of trenched DMOS cells and a gate metal area for forming a gate metal therein near a termination area disposed on an outer peripheral of said DMOS device, wherein said trenched DMOS device includes a plurality of trenched poly-fingers extending from trenched poly-gates of said DMOS cells to said gate metal area thus forming a trench-end region, said DMOS device further comprising:

a trenched gate-runner having a width substantially larger than said poly-fingers in said trench-end region comprising trenched polysilicon and connected to an end point of said poly-fingers wherein said trenched polysilicon in said trenched gates, said poly-fingers and said gate runner are disposed in said trenches whereby said DMOS device includes no above trench polysilicon layer in contact with said trenched polysilicon; and an insulation layer covering an entire area around said trench-end region wherein said insulation layer defining a plurality of openings provided for metal contacts including a plurality of gate contact openings above said gate runner provided for filling a gate metal therein for contacting said poly-fingers and said gate therefrom.

5. The DMOS device as recited in claim 4 wherein:

said trenched gates and poly-fingers extended therefrom having a width of approximately 1.0 micrometer and said gate runner having a width ranging from two to four microns (2.0–4.0 μs).

6. The DMOS device as recited in claim 4 further comprising:

a mobile ion blocking layer disposed under said insulation layer covering an enter top surface of said DMOS device other than said openings for provided for metal contacts.

7. The DMOS device as recited in claim 4 further comprising:

several floating ring regions of a conductivity type same as said body region disposed in said termination area next to said gate runner.

* * * * *